United States Patent
Yamamoto

(10) Patent No.: US 6,818,962 B2
(45) Date of Patent: Nov. 16, 2004

(54) IMAGE SENSOR HAVING INTEGRATED THIN FILM INFRARED FILTER

(75) Inventor: Katsumi Yamamoto, Shanghai (CN)

(73) Assignee: OmniVision International Holding Ltd, Cayman Islands (KN)

( * ) Notice: Subject to any disclaimer, the term of this patent is extended or adjusted under 35 U.S.C. 154(b) by 175 days.

(21) Appl. No.: 10/280,497

(22) Filed: Oct. 25, 2002

(65) Prior Publication Data

US 2004/0082092 A1 Apr. 29, 2004

(51) Int. Cl.[7] .......................... H01L 31/0232
(52) U.S. Cl. ................. 257/432; 257/290; 257/291; 257/294; 257/435; 257/437; 257/443; 257/444
(58) Field of Search .................. 257/222, 231–234, 257/290–294, 432, 435, 437, 443, 444

(56) References Cited

U.S. PATENT DOCUMENTS

| | | | |
|---|---|---|---|
| 5,904,493 A * | 5/1999 | Lee et al. | 438/57 |
| 6,171,885 B1 * | 1/2001 | Fan et al. | 438/70 |
| 6,252,218 B1 * | 6/2001 | Chou | 250/208.1 |
| 6,261,861 B1 | 7/2001 | Pai et al. | |
| 6,271,900 B1 * | 8/2001 | Li | 349/95 |
| 6,274,917 B1 | 8/2001 | Fan et al. | |
| 6,297,071 B1 | 10/2001 | Wake | |
| 6,320,617 B1 * | 11/2001 | Gee et al. | 348/302 |
| 6,362,513 B2 | 3/2002 | Wester | |
| 6,436,851 B1 | 8/2002 | Young et al. | |
| 6,590,239 B2 * | 7/2003 | Hsiung et al. | 257/233 |
| 6,617,189 B1 * | 9/2003 | Chen et al. | 438/48 |
| 2002/0063214 A1 * | 5/2002 | Hsiao et al. | 250/338.4 |
| 2002/0113888 A1 * | 8/2002 | Sonoda et al. | 348/315 |
| 2004/0082094 A1 * | 4/2004 | Yamamoto | 438/65 |

\* cited by examiner

*Primary Examiner*—Mary Wilczewski
*Assistant Examiner*—Toniae M. Thomas
(74) *Attorney, Agent, or Firm*—Perkins Coie LLP

(57) ABSTRACT

An image sensor is disclosed. The image sensor includes a plurality of pixels formed in a semiconductor substrate, each pixel including a light sensitive element. Further, a multilayer stack is formed over the pixels, the multilayer stack adapted to filter incident light in the infrared region. Finally, micro-lenses are formed over the multilayer stack and over the light sensitive element.

10 Claims, 3 Drawing Sheets

IMAGE SENSOR HAVING INTEGRATED THIN FILM INFRARED FILTER

TECHNICAL FIELD

The present invention relates to image sensors, and more particularly, towards an image sensor that incorporates a thin film infrared filter.

BACKGROUND

Image sensors are electronic integrated circuits that can be used to produce still or video images. Solid state image sensors can be either of the charge coupled device (CCD) type or the complimentary metal oxide semiconductor (CMOS) type. In either type of image sensor, a light gathering pixel is formed in a substrate and arranged in a two-dimensional array. Modern image sensors typically contain millions of pixels to provide a high resolution image. An important part of the image sensor are the color filters and micro-lens structures formed atop of the pixels. The color filters, as the name implies, are operative, in conjunction with signal processing, to provide a color image. The micro-lenses serve to focus the incident light onto the pixels, and thus to improve the fill factor of each pixel.

An infrared (IR) filter is typically used in conjunction with image sensors. The IR filter prevents or limits IR radiation from being incident to the image sensor. Many prior silicon-based pixels are reactive to light in the IR region. Thus, if IR radiation is incident on the pixel, the pixel will generate an output signal. This is undesirable in most applications of image sensors, since these image sensors are designed to provide an image based upon light visible to the human eye.

One common prior art method for solving this problem is to provide a discrete IR filter component in front of the image sensor and/or the lens of the image sensor. The IR filter may come in various forms, but may take the form of a coated glass filter. However, this adds to the cost of the entire camera apparatus.

DETAILED DESCRIPTION

The present invention relates to an image sensor that has an integrated IR filter. In the following description, numerous specific details are provided to provide a thorough understanding of the embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Reference throughout the specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
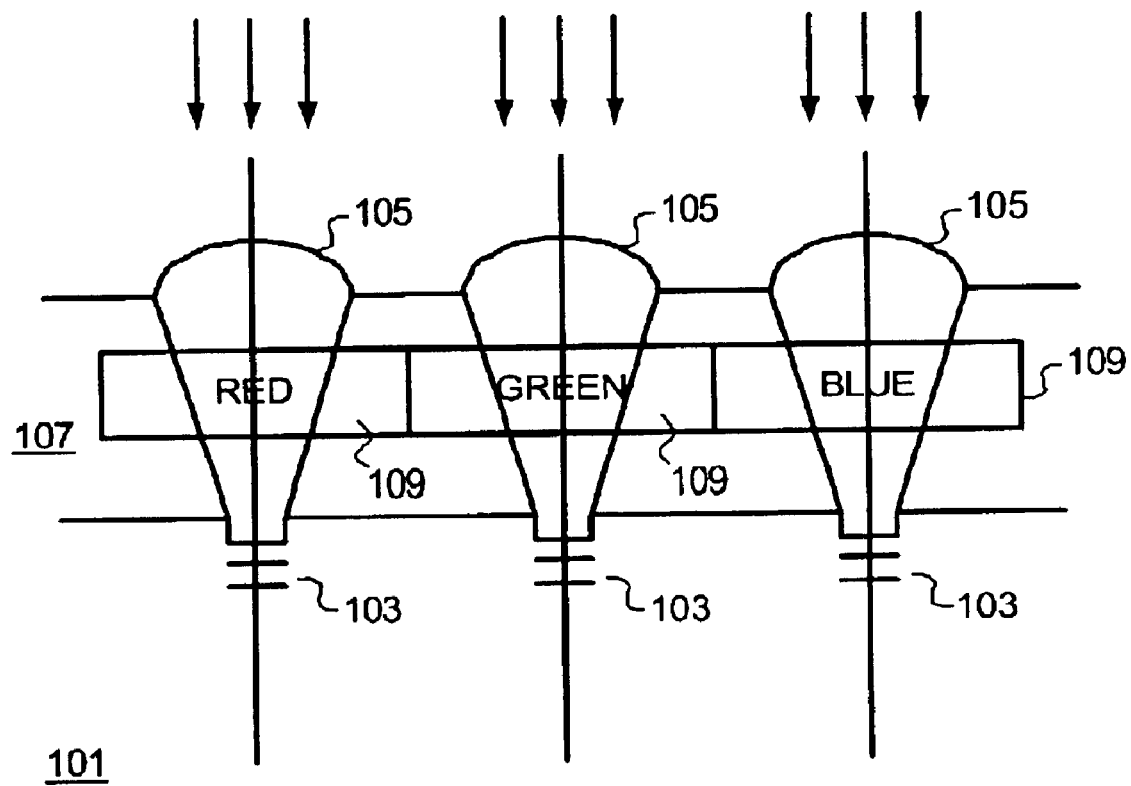
FIG. 1 is a prior art cross sectional view of a portion of an image sensor.

FIG. 1 shows a prior art cross-sectional simplified diagram of an image sensor 101 having micro-lenses formed thereon. As seen in FIG. 1, the image sensor includes a plurality of pixels that have light detecting elements 103 formed in the substrate. The light detecting elements 103 may be one of several types, such as a photodiode, a photogate, or other solid state light sensitive element. Formed atop of each pixel is a micro-lens 105. The micro-lens 105 focuses incident light onto the light detecting elements 103. Micro-lenses are often formed by spin coating a layer of micro-lens material onto a planarized layer. The micro-lens material is then etched to form cylindrical or other shaped regions that are centered above each pixel. Then, the micro-lens material is heated and reflowed to form a convex hemispherical micro-lens. Moreover, in the region between the light detecting elements 103 and the micro-lens 105, denoted by reference numeral 107, there are various intervening layers that would typically include the color filter layers 109 and various metal conducting lines. It can be appreciated that the structure of FIG. 1 is merely one example of an image sensor structure and that the present invention is adaptable to any number of variants. For example, the micro-lenses may be concave in nature as disclosed in my co-pending applications. Alternatively, the color filters 109 may be formed atop of the micro-lenses 105.

Figure 2:
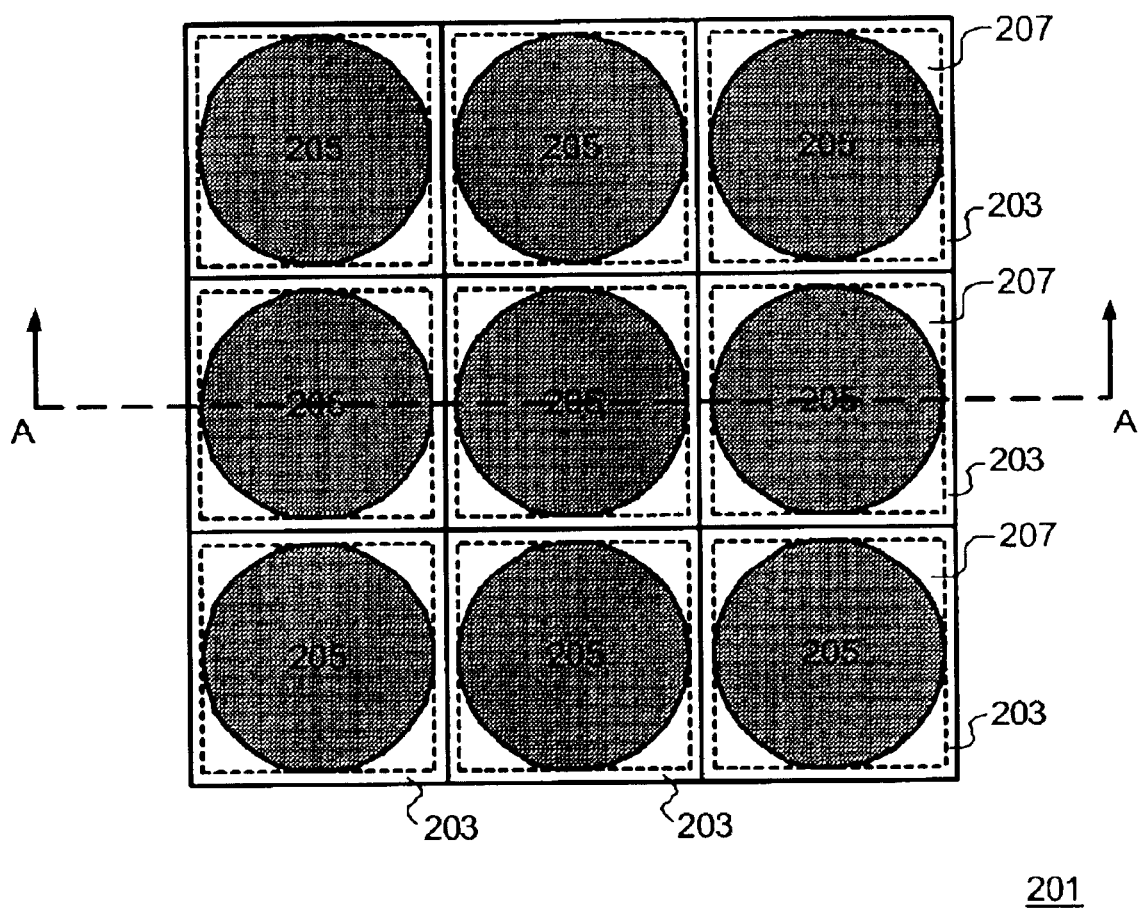
FIG. 2 is a top view of an image sensor showing pixels arranged in a two dimensional array and with micro-lenses formed thereon.

FIG. 2 shows a top view of an image sensor 201. The image sensor 201 includes a plurality of pixels 203 typically arranged in a two dimensional array. In the example shown in FIG. 2, the image sensor shows a three by three array of pixels 203, though it can be appreciated that an actual mage sensor 201 would have many more pixels, arranged in perhaps over a thousand rows and/or a thousand columns. Further, although FIG. 2 shows the pixels in ordered columns and rows, the pixels may be arranged in any type of ordered arrangement. For example, alternating rows may have their pixels slightly offset from each other laterally in a checkerboard format.

The pixels 203 typically include a light sensitive element, such as a photodiode or a photogate as two examples. However, it can be appreciated that other types of light sensitive elements, now known or developed in the future, may be used. Further, the pixels 203 will also include amplification and/or readout circuitry. For clarity, this circuitry is not shown in FIG. 2. In one embodiment, the pixels 203 may be active pixels, commonly known in the prior art. Formed atop of each pixel 203 is a micro-lens 205.

Additionally, associated with each pixel 203 is a color filter 207. The color filter 207 may be placed either between the micro-lens 205 and the light sensitive element, or alternatively, be formed atop of the micro-lens 205. The color filter 207 is typically a pigmented or dyed material that will only allow a narrow band of light to pass therethrough, for example, red, blue, or green. In other embodiments, the color filter may be cyan, yellow, or magenta. These are but example colors for the color filters 207 and the present invention is meant to encompass a color filter 207 having any color. While the use of pigmented or dyed color materials is the most prevalent form of color filters, other reflective type color filters may be used, such as a multilayer stack reflective material. The formation of color filters 207 is known in art and will not be described herein to avoid any unnecessary obscuration with the description of the present invention.

For example, U.S. Pat. Nos. 6,297,071, 6,362,513, and 6,271,900 show the current state of the color filter art. Not shown in the top view of FIG. 1 is the IR filter incorporated into the image sensor 201.

Figure 3:
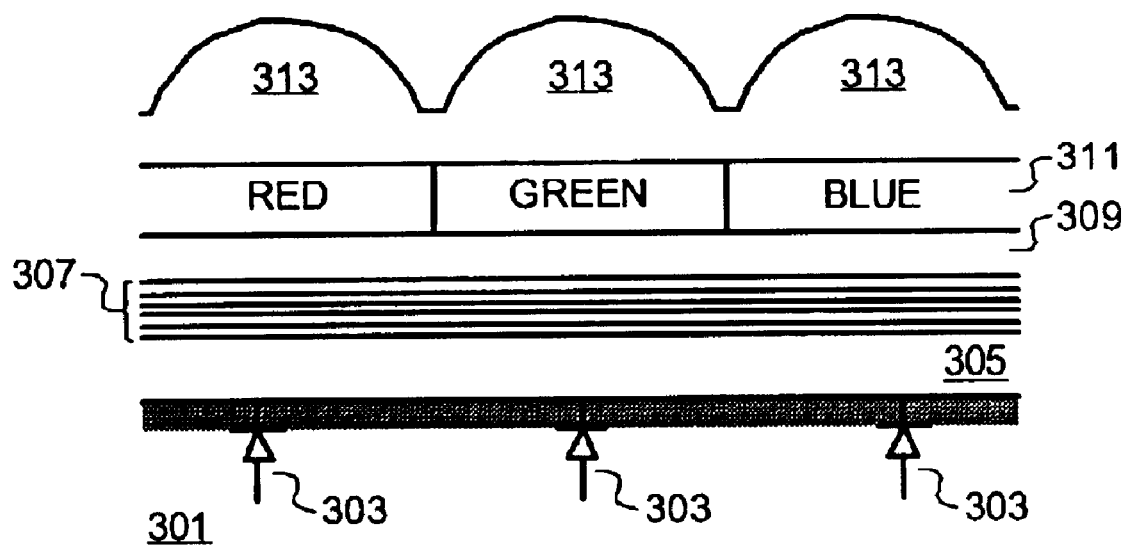
FIGS. 3 is a cross sectional of a semiconductor substrate illustrating an image sensor formed in accordance with one embodiment of the present invention.

FIG. 3 is a cross sectional view taken along line A—A of FIG. 2 which shows the IR filter 301 of the present invention. As seen, a semiconductor substrate 301 has a plurality of light sensitive elements 303 (associated with the pixels 203 of FIG. 2) formed therein. FIG. 3 shows the light sensitive element 303 as a photodiode, though other substitutes and equivalents may be used. Details of forming the photodiode and other associated circuitry are known in the prior art and will not be repeated herein to avoid obscuring the present invention. However, examples of the prior art may be seen in U.S. Pat. Nos. 5,904,493 and 6,320,617.

According to one embodiment, after the pixels 203 are formed in the substrate, an optically transparent (in at least a portion of the visible spectrum) base material 305 is formed over the substrate 301. The base material 305 may be formed using a blanket deposition process and may be various forms of silicon dioxide, such as thermal oxide, chemical vapor deposition (CVD) oxide, or spin on glass. The base material 305 may also be thought of as an interlayer dielectric.

Next, a multilayer stack 307 is deposited over the base material 305 and serves as an IR filter. In one embodiment, the multilayer stack 307 is adapted to reflect wavelengths in the 660–800 nm region and above. The multilayer stack 307 consists of a plurality of pairs of titanium oxide/silicon dioxide thin films. In one embodiment, 6 to 8 pairs of titanium oxide/silicon dioxide thin films comprise the multilayer stack 307, though more or fewer pairs would be possible, dependent upon the extent to which IR radiation needs to be reflected. With a higher number of pairs, a higher reflectance is achieved, though at added cost.

Further, the thickness of the thin film layers is to a large extent dependent upon the center wavelength to be reflected (i.e. rejected). Generally, the thickness of each thin film should be on the order of one-quarter of the center wavelength. Thus, to reject the center wavelength of 700 nm, the thin films of titanium oxide and silicon dioxide should be about 175 nm thick or 0.175 microns. Further, it should be noted that other materials may be used to form the pairs of thin films and the present invention should not be limited to titanium oxide/silicon dioxide thin films. In an alternative embodiment, the pairs of thin films may include an interlayer between the first and second films to increase thermal stability and to prevent interdiffusion. For example, the interlayer may be carbon.

Next, still referring to FIG. 3, a capping layer 309 is deposited onto the multilayer stack 307. The capping layer 309 is on the order of one micron thick. It should be noted that the capping layer 309 is optional. The capping layer 307 is useful in protecting the surface of the multilayer stack 307 during subsequent processing steps.

Next, color filters 311 are formed above the capping layer 307. The color filters 311 are formed using conventional processes. In the embodiment shown in FIG. 3, the color filters 311 are of the red, green, and blue coloration, but can be also cyan, yellow, and magenta. Finally, micro-lenses 313 are formed above the color filters 311. Similarly, the micro-lenses 313 can be formed using conventional processes, and may be convex as shown in FIG. 3 or other shape.

Several features of the present invention should be noted. First, an IR filter is implemented as a multilayer stack 307. Characteristically of multilayer stacks 307, they are reflective in nature and therefore deflect incident IR radiation away from the pixel. This is in contrast to absorptive pigment or dye based filters, which still may produce noise in the IR band and may not be as reliable. Second, in one embodiment, the multilayer stack 307 is formed prior to formation of the color filters. In general, when titanium oxide/silicon dioxide thin film pairs are deposited, this requires a relatively high heat, which may damage color filters 311 (which are typically made from organic materials). However, should later processes for making color filters 311 prove to be heat resistant, the multilayer stack 307 may be formed after (e.g. atop of) the color filters 311. The same holds true for the micro-lenses 313. Third, by integrating an IR filter onto the image sensor, the component count, and thus cost, of the image sensor can be reduced.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:
1. An image sensor comprising:
    a plurality of pixels formed in a semiconductor substrate, each pixel including a light sensitive element;
    a multilayer stack formed over said plurality of pixels, said multilayer stack adapted to filter incident light in the infrared region, wherein the multilayer stack comprise pairs of titanium oxide/silicon dioxide thin films;
    a plurality of micro-lenses formed over said multilayer stack and over said light sensitive element.
2. The image sensor of claim 1 further including a color filter formed over each pixel, said color filter formed between said micro-lens and said multilayer stack.
3. The image sensor of claim 1 further including a color filter formed over each pixel, said color filter formed over said micro-lens.
4. The image sensor of claim 1 wherein said multilayer stack comprise 6 to 8 pairs of titanium oxide/silicon dioxide thin films.
5. The image sensor of claim 1 wherein each thin film is approximately 200 nm thick.
6. A pixel of an image sensor comprising:
    a light sensitive element formed in a semiconductor substrate;
    a multilayer stack formed over said light sensitive element, said multilayer stack adapted to filter incident light in the infrared region, wherein the multilayer stack comprise pairs of titanium oxide/silicon dioxide thin films;
    a micro-lens formed over said multilayer stack and over said light sensitive element.
7. The pixel of claim 6 further including a color filter formed between said micro-lens and said multilayer stack.
8. The pixel of claim 6 further including a color filter formed over said micro-lens.
9. The pixel of claim 6 wherein said multilayer stack comprise 6 to 8 pairs of titanium oxide/silicon dioxide thin films.
10. The pixel of claim 6 wherein each thin film is approximately 175 nm thick.

* * * * *